(12) United States Patent
Shetty et al.

(10) Patent No.: US 6,766,265 B2
(45) Date of Patent: Jul. 20, 2004

(54) PROCESSING TESTER INFORMATION BY TRELLISING IN INTEGRATED CIRCUIT TECHNOLOGY DEVELOPMENT

(75) Inventors: Shivananda S. Shetty, Sunnyvale, CA (US); Jeffrey P. Erhardt, San Jose, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 10/323,000

(22) Filed: Dec. 18, 2002

(65) Prior Publication Data

US 2004/0122601 A1 Jun. 24, 2004

(51) Int. Cl.[7] .......................... G01D 3/00; G01M 19/00
(52) U.S. Cl. .................................................. 702/108
(58) Field of Search ......................... 702/35, 108, 113, 702/117, 179, 182; 324/158.1; 716/4

(56) References Cited

U.S. PATENT DOCUMENTS 5,793,940 A * 8/1998 Tajima et al. ................ 714/1

2002/0121915 A1 * 9/2002 Montull et al. ............. 324/765
2003/0101009 A1 * 5/2003 Seem .......................... 702/61
2003/0192003 A1 * 10/2003 Das et al. .................... 714/758

OTHER PUBLICATIONS

Miller et al., Deterministic Annealing for Trellis Quantizer and HMM design Using Baum–Welch Re–estimation, 1994, IEEE, vol. 5, p. V/261–4.*

Haystack Syndrome Avoidance on Massive Correlation for Probe vs. E–test data through the Concurrent Use of Tree Base Models and Trellis Graphics, 1999,IEEE, pp. 76–79.*

* cited by examiner

Primary Examiner—John Barlow
Assistant Examiner—Demetrius Pretlow
(74) Attorney, Agent, or Firm—Mikio Ishimaru

(57) ABSTRACT

A method for processing tester information is provided. The number of clusters of data in the tester information is determined to determine the number of data clusters. A basis is determined from the tester information to be used for plotting the data clusters. The data clusters are plotted on a plurality of trellis charts to form a trellising plot with a trellis of trellis charts.

20 Claims, 5 Drawing Sheets

Data Table A (with columns XA, YA, 1A...)

| Record # | XA | YA | 1A | 2A | 3A | 4A.. |
|---|---|---|---|---|---|---|
| A1 | 1 | 0 | | | | |
| A2 | 2 | 0 | | | | |
| A3 | 3 | 0 | | | | |
| A4 | 1 | 1 | | | | |
| A5 | 2 | 1 | | | | |
| ... | ... | ... | | | | |

800

Data Table B (with columns XB, YB, 1B, etc.

| Record # | XB | YB | 1B | 2B | 3B.. |
|---|---|---|---|---|---|
| B1 | 11 | 8 | | | |
| B2 | 12 | 8 | | | |
| B3 | 11 | 9 | | | |
| B4 | 12 | 9 | | | |
| B5 | 11 | 10 | | | |
| ... | ... | ... | | | |

900

XA ranges from 1-3    XB ranges from 11-12
YA ranges from 0-3    YB ranges from 8-10

1000

PROCESSING TESTER INFORMATION BY TRELLISING IN INTEGRATED CIRCUIT TECHNOLOGY DEVELOPMENT

BACKGROUND

1. Technical Field

The present invention relates generally to semiconductor technology and more specifically to semiconductor research and development and processing clustered data.

2. Background Art

Currently, electronic products are used in almost every aspect of life, and the heart of these electronic products is the integrated circuit. Integrated circuits are used in everything from airplanes, televisions and wristwatches to cameras and microwaves.

Integrated circuits are made in and on silicon wafers by extremely complex systems that require the coordination of hundreds or even thousands of precisely controlled processes to produce a finished semiconductor wafer. Each finished semiconductor wafer has hundreds to tens of thousands of integrated circuits, each worth hundreds or thousands of dollars.

The ideal would be to have every one of the integrated circuits on a wafer functional and within specifications, but because of the sheer numbers of processes and minute variations in the processes, this rarely occurs. "Yield" is the measure of how many "good" integrated circuits there are on a wafer divided by the total number of integrated circuits formed on the wafer divided by the maximum number of possible good integrated circuits on the wafer. A 100% yield is extremely difficult to obtain because minor variations, due to such factors as timing, temperature, and materials, substantially affect a process. Further, one process often affects a number of other processes, often in unpredictable ways.

In a manufacturing environment, the primary purpose of experimentation is to increase the yield. Experiments are performed in-line and at the end of the production line with both production wafers and experimental wafers. However, yield enhancement methodologies in the manufacturing environment produce an abundance of very detailed data for a large number of wafers on processes subject only to minor variations. Major variations in the processes are not possible because of the time and cost of using production equipment and production wafers. Setup times for equipment and processing time can range from weeks to months, and processed wafers can each contain hundreds of thousands of dollars worth of integrated circuits.

The learning cycle for the improvement of systems and processes requires coming up with an idea, formulating a test(s) of the idea, testing the idea to obtain data, studying the data to determine the correctness of the idea, and developing new ideas based on the correctness of the first idea. The faster the correctness of ideas can be determined, the faster new ideas can be developed. Unfortunately, the manufacturing environment provides a slow learning cycle because of manufacturing time and cost.

Recently, the great increase in the complexity of integrated circuit manufacturing processes and the decrease in time between new product conception and market introduction have both created the need for speeding up the learning cycle.

This has been accomplished in part by the unique development of the integrated circuit research and development environment. In this environment, the learning cycle has been greatly speeded up and innovative techniques have been developed that have been extrapolated to high volume manufacturing facilities.

To speed up the learning cycle, processes are speeded up and major variations are made to many processes, but on only a few wafers are processed to reduce cost. The research and development environment has resulted in the generation of tremendous amounts of data and analysis for all the different processes and variations. This, in turn, has required a large number of engineers to do the analysis. With more data, the answer always has been to hire more engineers.

However, this has not been the way to answer to some major of the problems.

The problems include, but are not limited to, the difficulty in analyzing data and charts where the axes of the charts are in one or two ranges and the data is clustered into a number of distinct data clusters.

The problems include, but are not limited to, the presence of data values significantly outside of the main distributions, which cause distortions of the scale of the charts.

The problems include, but are not limited to, the difficulty of joining a plurality of data tables whose row descriptors do not have unique matches.

Solutions to these problems have been long sought but prior developments have not taught or suggested any solutions and, thus, solutions to these problems have long eluded those skilled in the art.

DISCLOSURE OF THE INVENTION

The present invention provides a method for processing tester information. The number of clusters of data in the tester information is determined to determine the number of data clusters. A basis is determined from the tester information to be used for plotting the data clusters. The data clusters are plotted on a plurality of trellis charts to form a trellising plot with a trellis of trellis charts. This system provides the ability to quickly and efficiently analyze tester information data through the trellising of clustered data and thus increase output and tested device integrity in production.

Certain embodiments of the invention have other advantages in addition to or in place to of those mentioned above. The advantages will become apparent to those skilled in the art from a reading of the following detailed description when taken with reference to the accompanying drawings.

BEST MODE FOR CARRYING OUT THE INVENTION

Figure 1:
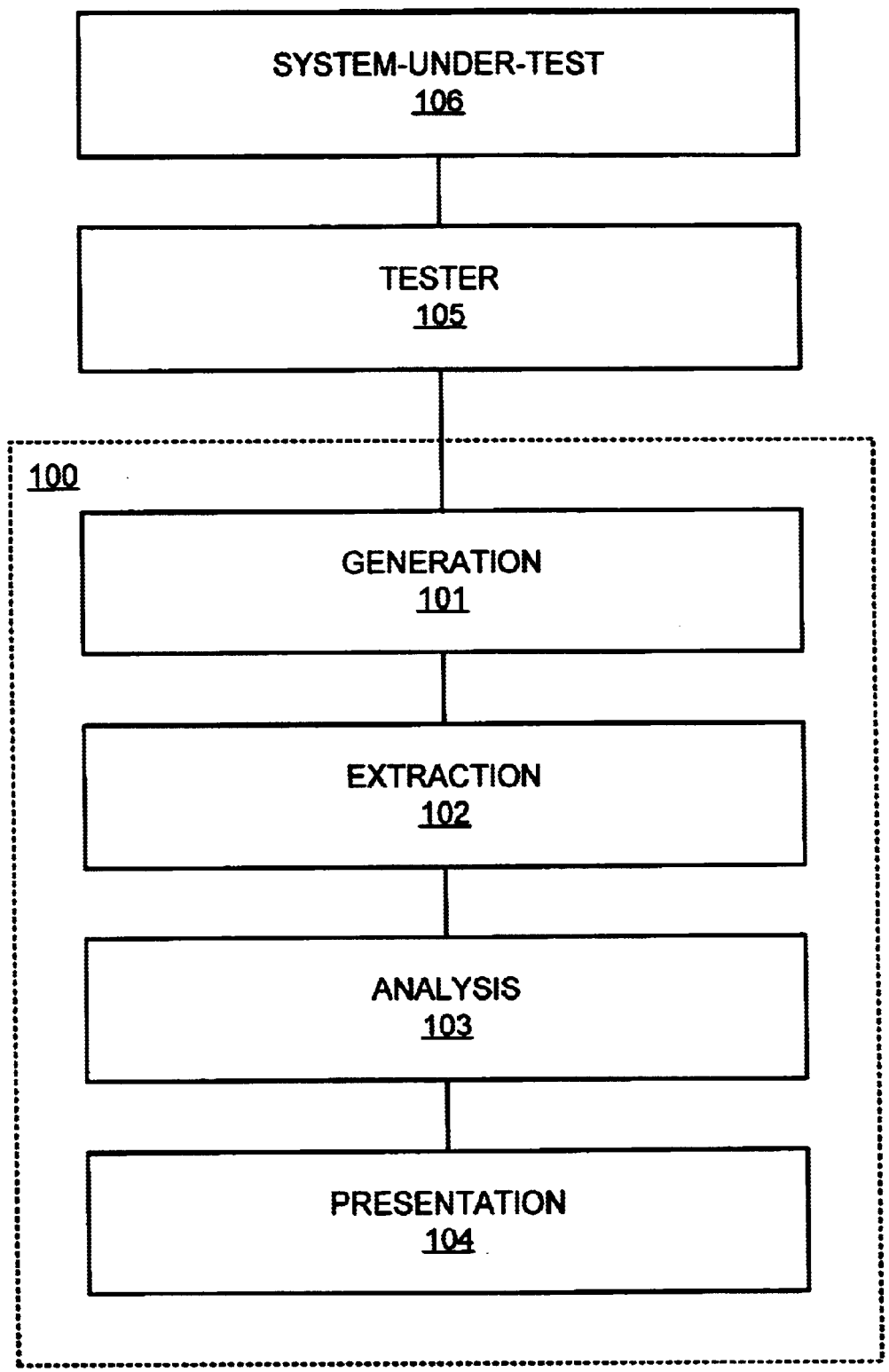
FIG. 1 is a block diagram of a tester information processing system according to the present invention.

Referring now to FIG. 1, therein is shown a block diagram of a tester information processing system 100 according to the present invention. The tester information processing system 100 is the result of the discovery that at times a single fundamental block can solve the problems presented but often there are four fundamental blocks to solving the problems presented.

The four fundamental blocks are a generation block 101, an extraction block 102, an analysis block 103, and a presentation block 104. Each of the blocks can stand independently in the tester information processing system 100, and within these blocks are various commercially available techniques, methodologies, processes, and approaches as well as the invention disclosed herein. The four fundamental blocks are discussed in the approximate chronology that the blocks are used in the tester information processing system 100.

The tester information processing system 100 includes various pieces of commercially available production, test, research, and development semiconductor equipment, which operate on and manipulate information and/or data, which are generically defined herein as "information". The tester information processing system receives information from a tester 105, which is connected to a system-under-test 106.

In the integrated circuit field, the tester 105 can be a semiconductor test system for testing wafers or die and the system-under-test 106 can be anything from a complete wafer down to an element of an individual semiconductor device on a die.

In the generation block 101, basic information is generated looking at new and old products, new and old processes, product and process problems, unexpected or unpredictable results and variations, etc. Generation of the information may use the tester 105 itself, a conventional test information, a personal computer, etc. It may also require new equipment and/or methods, which are described herein when required.

In the extraction block 102, usable information is extracted from the generated information from the generation block 101. Essentially, the generated information is translated into more useful forms; e.g., broken apart so it can be reassembled in different forms to show different inter-relationships.

For example, most testing equipment provides raw data in massive test files. Sometimes, millions of measurements provide millions of pieces of information, which must be digested and understood. The test files seldom have a user-friendly tabular output of parameter and value. Even where somewhat user-friendly outputs are provided, there are problems with the proper schema for storing the usable data and for formatting the data for subsequent analysis.

Extraction of the usable information may also require new equipment and/or methods. Sometimes, extraction includes storing the information for long duration experiments or for different experiments, which are described herein when required.

In the analysis block 103, the usable information from the extraction block 102 is analyzed. Unlike previous systems where a few experiments were performed and/or a relatively few data points determined, the sheer volume of experiments and data precludes easy analysis of trends in the data or the ability to make predictions based on the data. Analysis of the extracted information may also require new equipment and/or methods, which are described herein when required.

In the presentation block 104, the analyzed information from the analysis block 103 is manipulated and presented in a comprehensible form to assist others in understanding the significance of the analyzed data. The huge amount of analyzed information often leads to esoteric presentations, which are not useful per se, misleading, or boring. Proper presentation often is an essential ingredient for making informed decisions on how to proceed to achieve yield and processing improvements. In some cases, problems cannot even be recognized unless the information is presented in an easily understood and digested form, and this often requires new methods of presentation, which are described herein when required.

Figure 2:
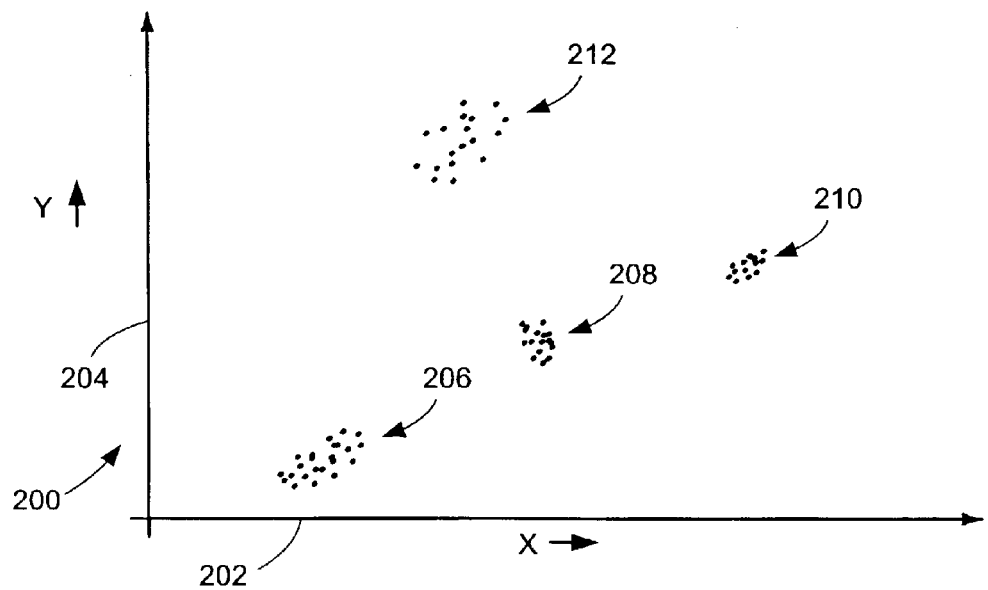
FIG. 2 (PRIOR ART) is an exemplary X-Y chart where the data is clustered into distinct groups in accordance with the present invention.

Referring now to FIG. 2 (PRIOR ART), therein is shown an exemplary X-Y plot 200 where data is clustered into distinct groups. The X-Y plot 200 has an X-axis 202 having a single range, and a Y-axis 204 also having a single range.

In the past, groups of data from the tester 105 of FIG. 1 would have been plotted and they would fall into data clusters 206, 208, and 210, which extend outwardly along the X-axis 202 and also outwardly along the Y-axis 204. An additional cluster of data 212 would fall away and above the data clusters 206, 208, and 210.

In some cases, the data clusters could be so far apart that the axes scales would make them appear as single dots. Then, the X-Y plot would be essentially useless.

Figure 3:
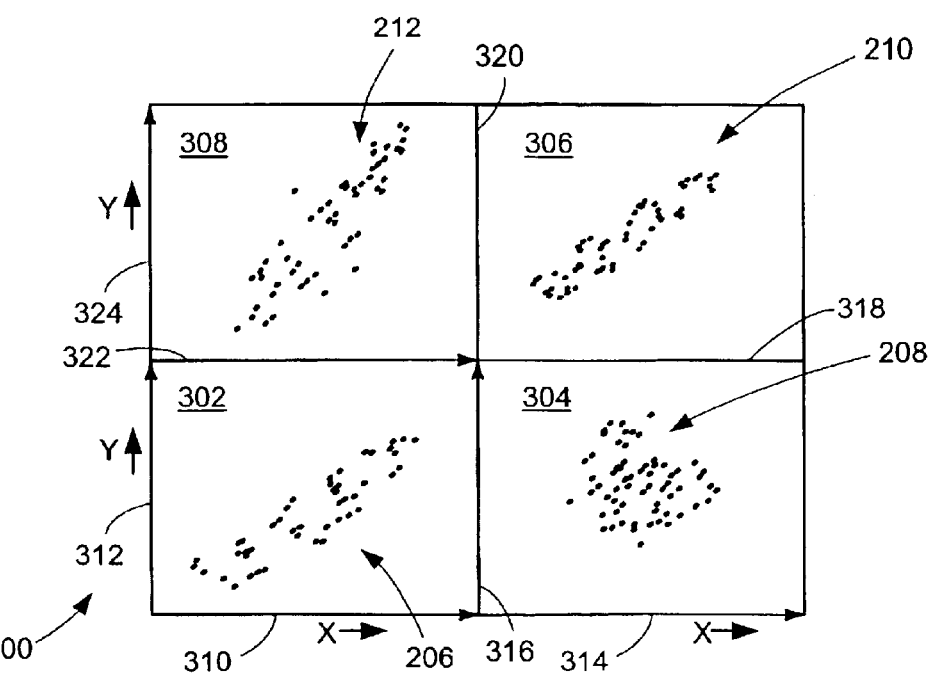
FIG. 3 is an automated trellising plot in accordance with the present invention.

Referring now to FIG. 3, therein is shown an automated trellising plot 300 made in accordance with the present invention. The automated trellising plot 300 consists of a plurality of charts, which are in a "trellis" based on selected parameters from the tester 105. A "trellis" of charts means that the charts are side-by-side, one-under-another, or a combination of side-by-side and one-under-another. Each chart in the trellis of charts would be a trellis chart. Generally, the automated trellising plot 300 will be plotted out on a conventional printer-plotter although the plot may just be displayed on visual displays.

For example, the automated trellising plot 300 consists of an array of four trellis charts 302, 304, 306, and 308, which respectively plot the same data as the data clusters 206, 208, 210, and 212 of FIG. 2 (PRIOR ART).

The data cluster 206, closest to the X-Y origin, is plotted on the trellis chart 302 having an X-axis 310 and a Y-axis 312.

The data cluster 208, further out from the X-Y origin, is plotted on the trellis chart 304 having an X-axis 314 and a Y-axis 316.

The data cluster 210, even further out from the X-Y origin, is plotted on the trellis chart 306 having an X-axis 318 and a Y-axis 320.

The data cluster 212, closest to the X-Y origin but above the other data clusters on the y-axis 204, are plotted on the trellis chart 308 having an X-axis 322 and a Y-axis 324.

Generally, the X-axes 310, 314, 318, and 322 will generally be of the same scale and the Y-axes 312, 316, 320, and 324 will generally be of the same scale in the automated trellising plot 300. The scales are generally determined by the size of the total automated trellising plot 300, the number of trellis charts, the span of the data points in each data cluster, and/or the variety of parameters.

The positioning of the trellis charts 302, 304, 306 and 308 relative to each other may be in any order, but generally it is preferred that they be in approximately the same relative positions as they are in prior art plots, such as the X-Y plot 200 of FIG. 2 (PRIOR ART).

However, it will be evident from the above description that the automated trellising plot 300 can be customized in a number of different ways. For example, the scales for one or more trellis charts could be different.

It will also be evident from the above description that different data clusters for different parameters as well as similar data clusters from different wafers on the tester 105 could also be automated trellising plotted in different trellis charts without departing from the scope of the present invention. In this case, the bases of the axes would be determined in a similar manner as the determination of the scales of the axes of the trellis charts.

Further, it will be understood that the present invention contemplates at least two trellis charts.

Further, from the above disclosure it will be evident that the different types of trellis charts may be used in accordance with the present invention. For example, a trellis of a box chart by wafer could be used. Such a chart would generate one box chart for every different wafer within a lot of wafers. A box plot is a type of chart used in analyzing data, which gives statistical measures within that chart.

In different types of manufacturing, data clusters from one device or different devices may be automated trellising plotted. In integrated circuit production, it will be understood that data from the same or different wafers may be automated trellising plotted Referring now to FIG. 4, therein is shown a block diagram 400 of a flowchart for the tester information processing system 100 of FIG. 1 having the tester 105 connected to the presentation block 104. The presentation block 104 contains a first block 402 where the raw data is examined to determine the number of data clusters, which are formed by the data. The number of data clusters determines the number of trellis charts, and the number of data clusters and the spread of the data points is provided to a box 404 to determine scaling of the trellis charts. Finally the information is provided to a block 406 to plot the data by forming the trellis charts and plotting the data at the determined scale.

Figure 4:
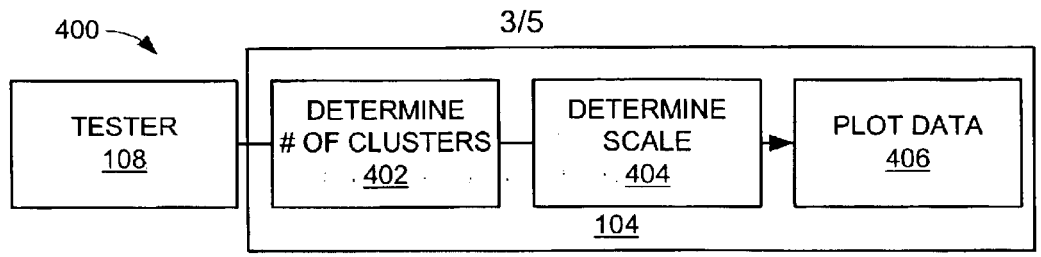
FIG. 4 is a block diagram of a flowchart for the tester information processing system of the present invention.

It will be understood from the above that FIG. 4 provides both a flowchart for software as well as a connection arrangement for hardware, such as computer circuitry, with each of the blocks representing applicable circuitry; e.g., block 402 would be cluster circuitry, block 404 would be scaling circuitry, and block 406 would be automation circuitry.

Figure 5:
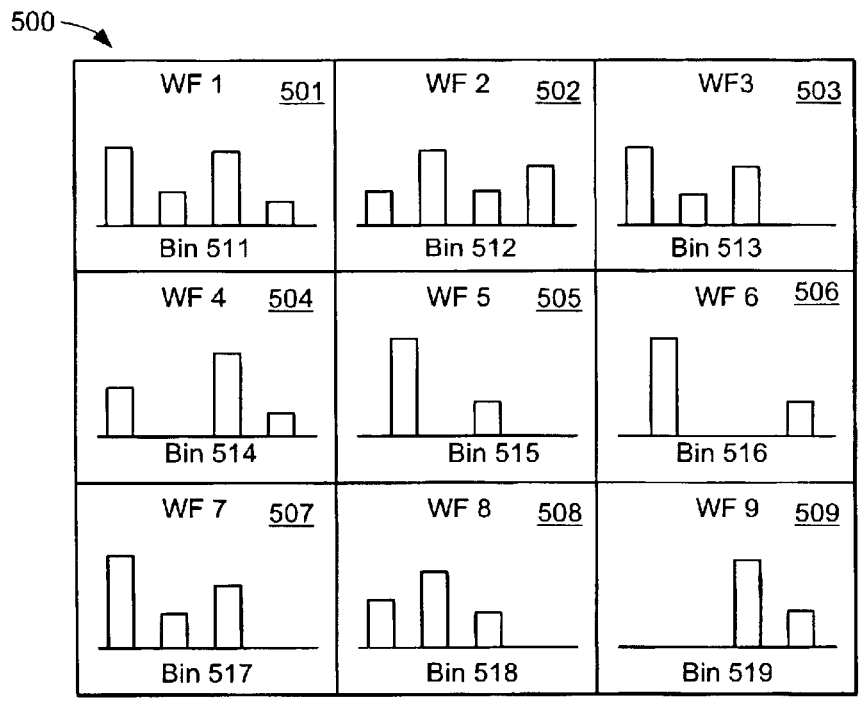
FIG. 5 is an exemplary array mapping of a plurality of histograms in accordance with the present invention.

Referring now to FIG. 5, therein is shown an array mapping 500 for a discontinuous graphic chart. The array mapping 500 is of a plurality of histograms 501 through 509. In the exemplary array mapping 500, data for a plurality of wafers has been sorted into bins, such as the bins 511 through 514 in the histogram 501.

It would be understood that similar array mappings based on the binning of data can also be used for pie charts, bar graphs, etc.

Figure 6:
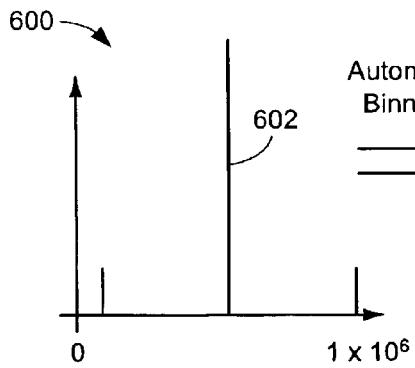
FIG. 6 is a chart showing a bar graph indicating the ideal binning situation for test data in accordance with the present invention.

Referring now to FIG. 6, therein is shown a chart 600 showing a bar graph 602 indicating the ideal binning situation for test data.

Figure 7:
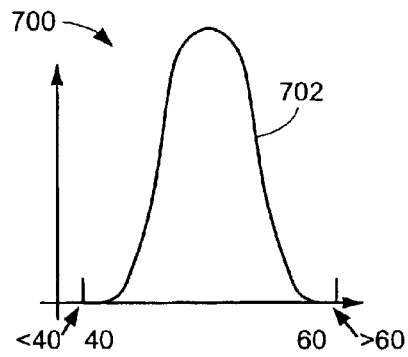
FIG. 7 is a chart of the typical results of automatic binning as in the present invention.

Referring now to FIG. 7, therein is shown a chart 700 of the typical results of automatic binning. A curve 702 depicts a standard Gaussian distribution which can be used to determine the bins 511 through 519 in which data can be placed for the histograms 501 through 509 in FIG. 5 which make up the array mapping 500.

In the present invention, the data will be received from the tester 105 of FIG. 1 and processed in the presentation block 104 to be automatically binned with the binned data being used to form the desired histogram, pie chart, bar graph, etc. As would be evident to those having ordinary skill in the art from the above explanation, it will be evident that the automatic binning technique and plotting as an array or trellis will eliminate the negative effects of outlier data.

Figures 8, 9, 10:
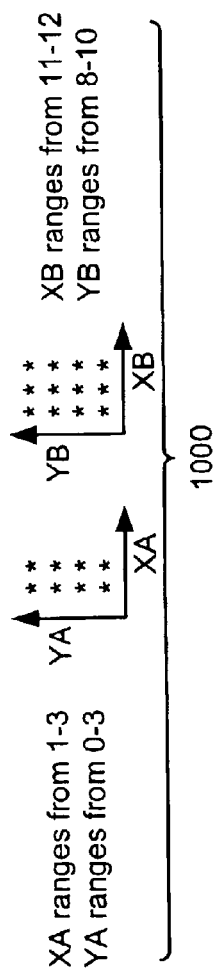
FIG. 8 shows a database having row descriptors, which do not have unique matches with the row descriptors shown in FIG. 9.
FIG. 9 shows a database having row descriptors, which do not have unique matches with row descriptors shown in FIG. 8.
FIG. 10 is the range of values for each non-descriptor column in the databases shown in FIG. 8 and FIG. 9, respectively.

Referring now to FIGS. 8 and 9, therein are shown two databases 800 and 900 having row descriptors, which do not have unique matches. For example, in FIGS. 8 and 9, the row descriptors of record numbers A1 through A5 in FIG. 8 do not match the row descriptors of record numbers B1 through B5 in FIG. 9.

In the present invention, the row descriptors in each table are identified and then the range of values for each row descriptor column in both tables is determined. The column row descriptors are XA, YA, 1A, 2A, 3A, 4A, etc. for database 800 and are XB, YB, 1B, 2B, 3B, 4B, etc. for the database 900 of FIG. 9.

Referring now to FIG. 10, therein is shown the range of values 1000 for each non-descriptor column in the databases 800 and 900 of FIGS. 8 and 9, respectively.

Figure 11:
FIG. 11 shows table map results of the automatically merged data using the mapping created for each pair of row descriptor columns in FIGS. 8 and 9.

Referring now to FIG. 11, therein is shown table map results 1100. The table map results 1100 is the automatically merged data using the mapping created for each pair of row descriptor columns.

It will be understood by those having ordinary skill in the art based on the above description that various well-known interpolation formulas (such linear interpolation) can be used based on the ranges of each pair of row descriptor columns to provide the table map results 1100.

Based on the above and as would be obvious to those skilled in the art from the above description, one-to-one or one-to-many mappings can be created.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

The invention claimed is:

1. A method for processing tester information comprising:
   determining the number of clusters of data in the tester information to determine the number of data clusters;
   determining a basis from the tester information to be used for plotting the data clusters; and
   plotting the data clusters on a plurality of trellis charts to form a trellising plot with a trellis of the trellis charts.

2. The method as claimed in claim 1 wherein determining the basis for the data clusters determines a different basis for each of the data clusters.

3. The method as claimed in claim 1 wherein plotting the data clusters includes determining positions for the trellis charts in the trellising plot based on distance from the origin of one of the trellis charts in the trellising plot.

4. The method as claimed in claim 1 wherein plotting the data clusters includes having different trellis charts for different parameters of the tester information.

5. The method as claimed in claim 1 wherein plotting the data clusters plots different data clusters from different devices tested on a tester.

6. A method for processing tester information comprising:
determining the number of clusters of data in the tester information to determine the number of data clusters;
determining a scale from the tester information to be used for plotting the data clusters; and
plotting the data clusters on a plurality of trellis charts to form an automated trellising plot with a trellis of the trellis charts.

7. The method as claimed in claim 6 wherein determining the scale for the data clusters determines a different scale for each of the data clusters.

8. The method as claimed in claim 6 wherein plotting the data clusters includes determining positions for the trellis charts in the trellising plot based approximately the same relative positions that the data clusters would appear on a single X-Y plot.

9. The method as claimed in claim 6 wherein plotting the data clusters includes having different trellis charts for different parameters of the tester information and different types of trellis charts for the different parameters.

10. The method as claimed in claim 6 wherein plotting the data clusters plots different data clusters from the same or different devices tested on a tester.

11. A tester information processing system comprising
means for determining the number of clusters of data in the tester information to determine the number of data clusters;
means for determining a basis from the tester information to be used for plotting the data clusters; and
means for plotting the data clusters on a plurality of trellis charts to form a trellising plot with a trellis of the trellis charts.

12. The method as claimed in claim 11 wherein the means for determining the basis for the data clusters determines a different basis for each of the data clusters.

13. The method as claimed in claim 11 wherein the means for plotting the data clusters includes determining positions for the trellis charts in the trellising plot based on distance from the origin of one of the trellis charts in the trellising plot.

14. The method as claimed in claim 11 wherein the means for plotting the data clusters includes having different trellis charts for different parameters of the tester information.

15. The method as claimed in claim 11 wherein the means for plotting the data clusters plots different data clusters from different devices tested on a tester.

16. A tester information processing system comprising:
circuitry to determine the number of data clusters in the tester information;
scaling circuitry to determine a scale from the tester information to be used for plotting the data clusters; and
automation circuitry to plot the data clusters on a plurality of trellis charts to form an automated trellising plot with a trellis of the trellis charts.

17. The method as claimed in claim 16 wherein the circuitry for determining the scale for the data clusters determines a different scale for each of the data clusters.

18. The method as claimed in claim 16 wherein the automation circuitry includes determining positions for the trellis charts in the trellising plot based approximately the same relative positions that the data clusters would appear on a single X-Y plot.

19. The method as claimed in claim 16 wherein the automation circuitry for plotting the data clusters includes having different trellis charts for different parameters of the tester information and different types of trellis charts for the different parameters.

20. The method as claimed in claim 16 wherein the automation circuitry for plotting the data clusters plots different data clusters from the same or different devices tested on a tester.

* * * * *

UNITED STATES PATENT AND TRADEMARK OFFICE
CERTIFICATE OF CORRECTION

PATENT NO. : 6,766,265 B2
DATED : July 20, 2004
INVENTOR(S) : Shetty et al.

It is certified that error appears in the above-identified patent and that said Letters Patent is hereby corrected as shown below:

Column 1,
Line 13, delete "arc" and insert therefor -- are --

Column 2,
Line 6, delete "arc" and insert therefor -- are --
Line 42, delete "to"

Column 3,
Line 48, delete "arc" and insert therefor -- are --

Signed and Sealed this

Thirtieth Day of November, 2004

JON W. DUDAS
*Director of the United States Patent and Trademark Office*